United States Patent
Kouda et al.

(10) Patent No.: US 8,785,787 B2
(45) Date of Patent: Jul. 22, 2014

(54) METAL-BASED CIRCUIT BOARD

(75) Inventors: Souhei Kouda, Ina (JP); Toshiharu Takayama, Minowa-machi (JP)

(73) Assignee: Koa Kabushiki Kaisha, Nagano (JP)

( * ) Notice: Subject to any disclaimer, the term of this patent is extended or adjusted under 35 U.S.C. 154(b) by 166 days.

(21) Appl. No.: 13/407,585

(22) Filed: Feb. 28, 2012

(65) Prior Publication Data

US 2012/0217047 A1 Aug. 30, 2012

(30) Foreign Application Priority Data

Feb. 28, 2011 (JP) .................................. 2011-043086
Feb. 10, 2012 (JP) .................................. 2012-027407

(51) Int. Cl.
*H05K 1/09* (2006.01)

(52) U.S. Cl.
USPC .......................... 174/257; 174/255; 361/748

(58) Field of Classification Search
CPC ........... H05K 1/03; H05K 1/05; H05K 1/053; H05K 1/056; H05K 2201/017; H05K 2201/06; H05K 2201/068; H01L 23/28; H01L 23/36; H01L 23/48866
USPC ........................ 174/250, 255, 256, 257, 261; 361/748–751
See application file for complete search history.

(56) References Cited

U.S. PATENT DOCUMENTS

| | | | |
|---|---|---|---|
| 2005/0205297 A1* | 9/2005 | Suwa et al. ................. | 174/257 |
| 2006/0191707 A1* | 8/2006 | Ishikawa et al. .............. | 174/250 |
| 2009/0114429 A1* | 5/2009 | Sri-Jayantha et al. ........ | 174/255 |
| 2011/0005810 A1* | 1/2011 | Uneno et al. ................. | 174/252 |
| 2011/0024172 A1* | 2/2011 | Maruyama et al. ........... | 174/258 |

FOREIGN PATENT DOCUMENTS

JP          05-327151 A          12/1993

* cited by examiner

*Primary Examiner* — Hoa C Nguyen
(74) *Attorney, Agent, or Firm* — Smith Patent Office

(57) ABSTRACT

A metal-based circuit board, which reduces the influence of thermal expansion, is provided having a structure where an insulating layer A having a large coefficient of thermal expansion is sandwiched between insulating layers B having a small coefficient of thermal expansion. Such a structure allows the insulating layers B to contract and expand so as to suppress contraction and expansion of the insulating layer A and thereby reduce the stress in the direction of negating the stress. As a result, while warpage or distortion is suppressed to be minimal, the bonding strength of the upper and the lower layer is maintained, and degree of freedom for circuit design is not impaired, thereby providing a highly reliable circuit structure.

6 Claims, 5 Drawing Sheets

METAL-BASED CIRCUIT BOARD

BACKGROUND OF THE INVENTION

The present invention relates to a metal-based circuit board.

Conventionally, wiring ceramic substrates on which a circuit is formed and electronic components are mounted have been used. However, since such ceramic substrates have insufficient heat dissipation capacity for some applications, in order to provide a multilayer interconnection board with higher heat dissipation, a wiring substrate with a metal plate base, such as an aluminum plate, has been used in place of lo the ceramic substrates.

However, use of the metal plate has a problem that distortion and warpage develops due to heat generated by calcination etc. in a manufacturing process as it expands and contracts more easily due to heat than the insulating layer and the printed circuit formed on the substrate even though the metal plate has a higher heat dissipation capacity because it is made of a metal.

Laid-open Japanese Patent Application No. 5-327151, for example, discloses a conventional technology of a metal-based wiring substrate. JP 5-327151A discloses a metal-based circuit board having an improved insulator between a metal base and a conductive layer, which secures insulation while keeping heat dissipation capacity and prevents warpage and contortion of the metal base.

However, with the conventional metal-based circuit board, warpage of the metal plate could not be prevented completely since the base board is different in coefficient of thermal expansion from the printed circuit and the insulating layer formed on the base board. Moreover, there is another problem that the stress on the printed circuit and the metal plate generated through a heat cycle impairs the connection reliability between the printed circuit and the mounted components.

Furthermore, if forming a multilayered, printed circuit on a substrate is possible, the degree of freedom for circuit design may increase. However, distortion or warpage of the substrate may easily develop due to the multilayers, and disconnection may easily occur in the printed circuit.

SUMMARY OF THE INVENTION

The present invention is made to solve the problems described above, and aims to provide a metal-based circuit board which prevents distortion and warpage thereof. The following configurations are provided as countermeasures for solving the problems described above.

That is, a metal-based circuit board according to the present invention is characterized in that it includes a first conductor layer formed on a substrate made of a metal material via an insulating layer, and a second conductor layer formed on the first conductor layer via an insulating layer; wherein the insulating layer between the first and the second conductor layer comprises a first intermediate insulating layer and second intermediate insulating layers, and has a structure of the first intermediate insulating layer sandwiched between the second intermediate insulating layers; wherein coefficient of thermal expansion of the first intermediate insulating layer is larger than that of the second intermediate insulating layers.

For example, the metal-based circuit board is characterized in that the first and the second conductor layer do not come in direct contact with the first intermediate insulating layer. Furthermore, for example, it is characterized in that the insulating layer between the first and the second conductor layer has a structure where the first intermediate insulating layer is completely wrapped by the second intermediate insulating layers.

For example, the metal-based circuit board is characterized in that coefficient of thermal expansion of the first intermediate insulating layer and that of the second intermediate insulating layers are smaller than that of the substrate, and larger than those of the first and the second conductor layer.

Furthermore, for example, it is characterized in that the insulating layer between the substrate and the first conductor layer has a structure where a first insulating layer is formed on the surface of the substrate, a second insulating layer having a smaller coefficient of thermal expansion than that of the first insulating layer is formed on the first insulating layer, and the first conductor layer is formed on the second insulating layer.

Moreover, a metal-based circuit board is characterized in that it includes insulating layers each having a different coefficient of thermal expansion laminated on a substrate made of a metal material; wherein the insulating layers on the substrate have a structure where a first insulating layer is formed on the surface of the substrate, the second insulating layer having a smaller coefficient of thermal expansion than that of the first insulating layer is formed on the first insulating layer, and a conductor layer is formed on the second insulating layer.

For example, it is characterized in that an insulating layer is formed on the rear side of the substrate.

The metal-based circuit board according to the present invention may suppress to the utmost the influence of distortion or warpage of the substrate on the circuit. Moreover, the present invention makes it possible to form a multilayered, electric conductor and provide a metal-based circuit board with a higher heat dissipation capacity, which improves the degree of freedom for circuit design.

DESCRIPTION OF THE PREFERRED EMBODIMENTS

Figure 1:
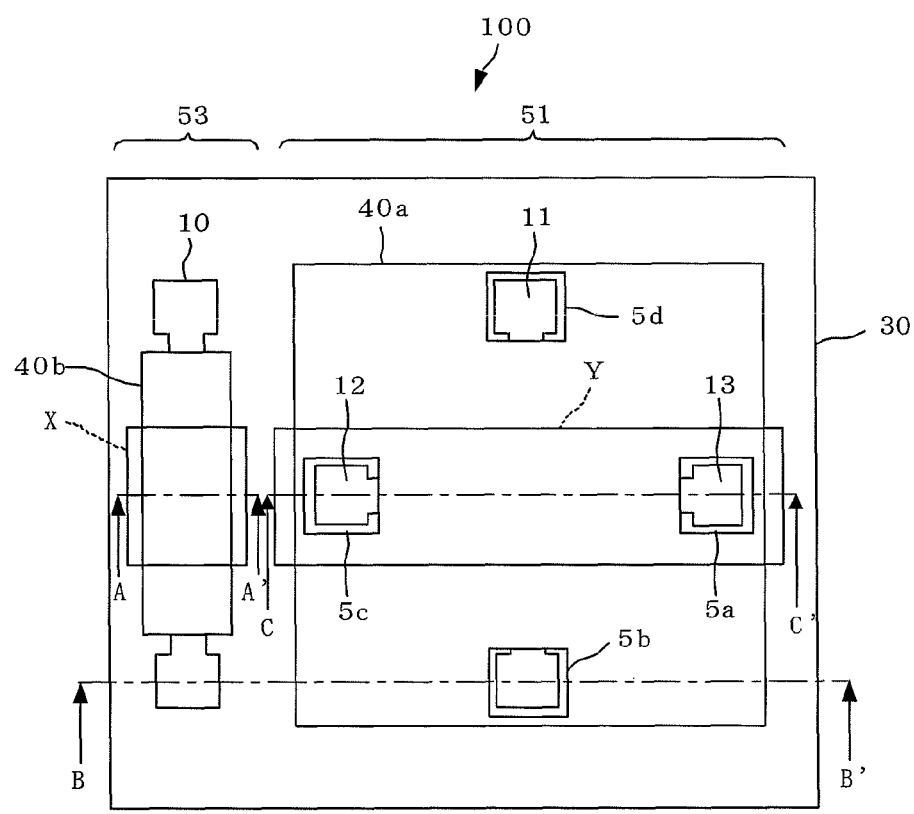
FIG. 1 is a plan view of a metal-based circuit board according to an embodiment of the present invention.
Figure 2:
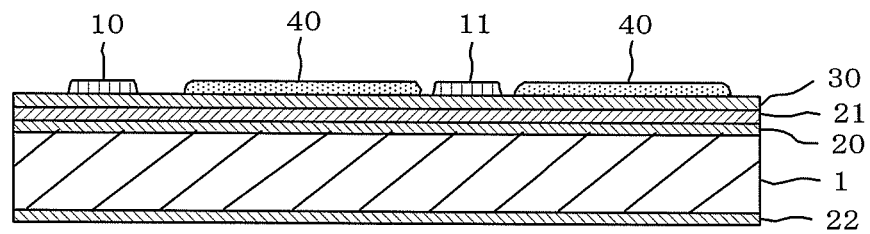
FIG. 2 is a cross-sectional view taken along line B-B' of FIG. 1.
Figure 3:
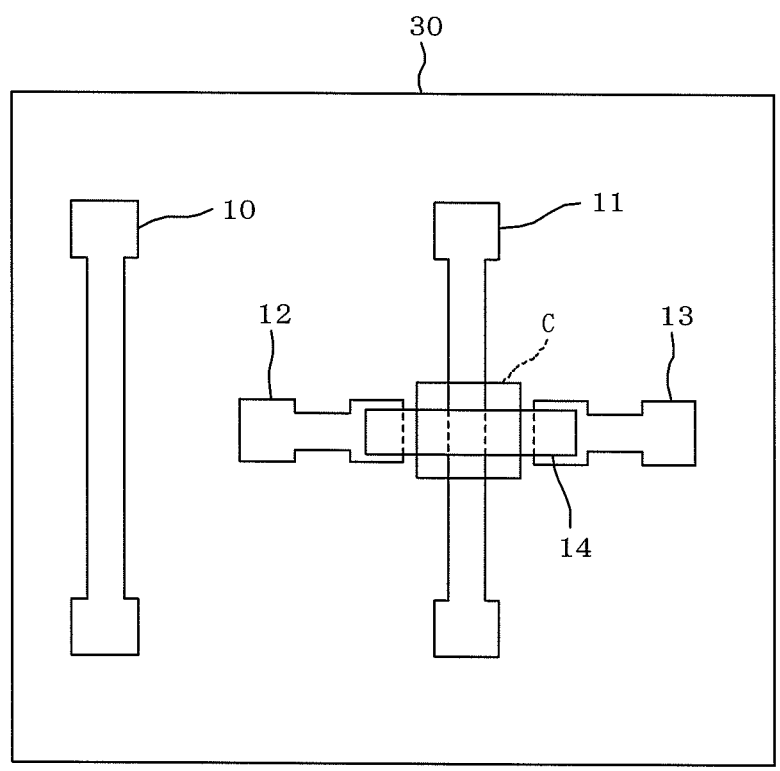
FIG. 3 is an illustration of a view when an overcoat layer is removed from the metal-based circuit board according to the embodiment.
Figure 4:
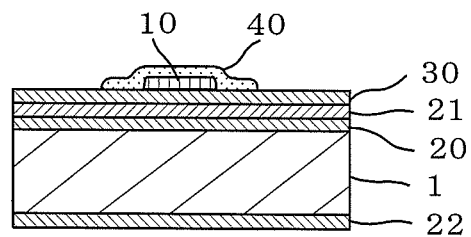
FIG. 4 is a cross-sectional view taken along line A-A' of FIG. 1.
Figure 6:
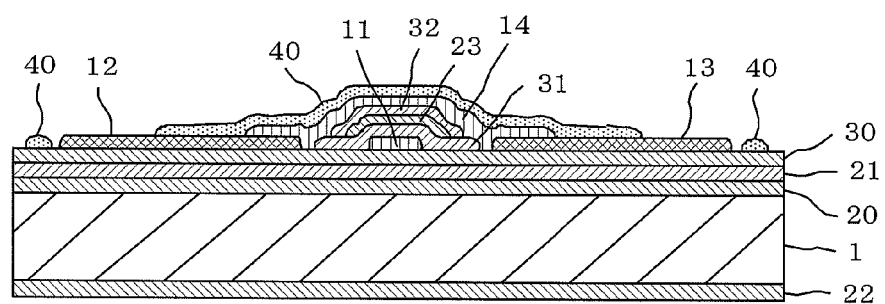
FIG. 6 is a cross-sectional view taken along line C-C' of FIG. 1.

Hereafter, an embodiment according to the present invention is described with reference to accompanied drawings. FIG. 1 is a plan view of a metal-based circuit board according to this embodiment of the present invention. FIG. 2 is a cross-sectional view taken along line B-B' of FIG. 1. FIG. 4 is a cross-sectional view taken along line A-A' in portion X of FIG. 1. FIG. 6 is a cross-sectional view taken along line C-C' in portion Y of FIG. 1. A metal-based circuit board 100 shown in FIG. 1 is equipped with wiring regions 51 and 53, each having a different layer structure to be described later. The wiring region 51 has a multilevel interconnection structure including a wiring pattern covered by an overcoat layer 40a and an insulating layer, and the wiring region 53 has a single-level interconnection structure including a wiring pattern covered by an overcoat layer 40b and an insulating layer. Moreover, FIG. 3 is an illustration of a view when the overcoat layers 40a and 40b are removed from the metal-based circuit board 100 in FIG. 1. Note that the overcoat layers 40a and 40b are also simply referred to as overcoat layer 40.

As shown in FIG. 3, a rectilinear-shaped wiring pattern 11 in which both ends thereof are formed wider, rectilinear-shaped wiring patterns 12 and 13 having respective wider ends in the same manner, and a rectilinear-shaped wiring pattern 14, which straddles the wiring pattern 11 connecting the wiring patterns 12 and 13, are arranged in the wiring region 51. Reference character C in FIG. 3 indicates an intersection of the wiring pattern 11 and the wiring pattern 14. Moreover, a rectilinear-shaped wiring pattern 10 with ends formed wider in the same manner as the wiring pattern 11 is arranged in the wiring region 53. In addition, the wiring pattern 11 is defined as a first conductor layer while the wiring pattern 14 is defined as a second conductor layer.

As shown in FIG. 1, each of openings 5a to 5d is formed in the rectangular-shaped overcoat layer 40a near the center portion of each side thereof. Thereby, in the wiring region 51, parts of the wiring pattern described above are exposed to the outside via the openings 5a to 5d. More specifically, when the metal-based circuit board 100 is observed from above, one end of the wiring pattern 11 is exposed to the outside from the opening 5d, the other end is exposed to the outside from the opening 5b, and the ends of the respective wiring patterns 12 and 13 are exposed to the outside from the openings 5c and 5a, respectively.

The overcoat layer 40b is formed in the wiring region 53 so as to cover a wiring portion between the wider ends of the wiring pattern 10. Both of the ends of the wiring pattern 10 are not covered by an overcoat layer, but are exposed to the outside.

Bare chip mounting of electronic components, such as an IC chip, on the metal-based circuit board 100 is carried out. The ends of the wiring pattern exposed from the openings 5a to 5d and both of the ends of the wiring pattern 10 are connected to terminals of electronic components through wire bonding, flip chip mounting, etc. Note that the circuit configuration of the metal-based circuit board 100 is simplified and shown for explaining the present invention. The configuration may be modified according to electronic components etc. to be mounted as necessary and is not limited to this embodiment.

The metal-based circuit board 100 according to this embodiment includes a base board made of a metal, such as aluminum or an aluminum alloy. Here, with regard to difference in material melting temperature between the metal plate and the ceramic substrate (alumina substrate), alumina (96%), which is a material of the ceramic substrate, is 1500° C. and aluminum is 650° C., which is lower.

Accordingly, sintering temperature of a circuit using an alumina substrate is generally 850° C. at the time of circuit formation, and sintering temperature of a circuit using an aluminum substrate is 580° C. Since such an aluminum substrate melts at a lower temperature than the ceramic substrate, it needs to be calcinated at a sintering temperature near the melting temperature.

Meanwhile, with regard to the printed circuit (wiring pattern) formed on a substrate, difference in coefficient of thermal expansion from the substrate and difference in coefficient of thermal expansion between printed objects contribute to distortion or warpage of the substrate. A junctioned combination of an electric conductor, an insulator, and a substrate, each having a different coefficient of thermal expansion, thus greatly contributes to warpage or distortion of the substrate as a whole. Therefore, it is necessary to control warpage or distortion of the substrate to be minimal, and to design a reliable circuit which keeps bonding strength between respective layers even with an elaborate, multilayered circuit and also keeps the degree of freedom for designing.

Accordingly, in the metal-based circuit board according to this embodiment, an insulating layer having three layers made from two different insulating materials in coefficient of thermal expansion is prepared between a metal plate and a conductor layer or between conductor layers, as will be described in detail below. Moreover, the middle layer of the three insulating layers is different in coefficient of thermal expansion from the upper and the lower layer.

In the metal-based circuit board 100 according to this embodiment, as shown in FIG. 2 or a cross-sectional view taken along the line B-B' of FIG. 1 and FIG. 4 or a cross-sectional view taken along the line A-A' of FIG. 1, an insulating layer 20 made of an insulating material X is formed on a metal plate 1 so as to secure insulation against the metal plate 1, and an insulating layer 21 made of the insulating material X is formed as a second insulating layer on the insulating layer 20, so as to strengthen the withstand voltage. Furthermore, an insulating layer 30 made of an insulating material Y having a smaller coefficient of thermal expansion than that of the insulating material X is formed as a third insulating layer on the insulating layer 21.

Moreover, an insulating layer 22 made of the insulating material X is formed on the rear side of the metal plate 1. In this embodiment, the insulating layer 22 is widely formed on the rear side of the metal plate 1 in the same manner as the insulating layer 20 formed on the surface of the metal plate 1 as described above. Note that in this embodiment, the insulating layers made of the insulating material X may be collectively referred to as insulating layer A, and insulating layers made of the insulating material Y may be collectively referred to as insulating layer B.

A glass or a glass material made of a composite material of a glass and ceramics is used as a material for these insulating layers 20, 21, 22, and 30 (insulating material X or insulating material Y), and the same material is also used as a material for an overcoat layer (protection layer) described later.

More specifically, coefficient of thermal expansion of the material of the metal plate 1, which is made of aluminum or an aluminum alloy, is 23 to 25 ppm/° C., and in the case of using an Ag electric conductor as the wiring patterns 10 to 14, the coefficient of thermal expansion of Ag is 7 to 8 ppm/° C. Therefore, a glass material having the coefficient of thermal expansion of 18 ppm/° C., for example, is adopted as the aforementioned insulating material X for the metal-based circuit board 100 according to this embodiment. Moreover, a glass material having the coefficient of thermal expansion of 10 ppm/° C., for example, is adopted as the insulating material Y. An example of the glass materials used as the insulating material X or the insulating material Y is $Na_2O$—$CaO$—$SiO_2$—$Al_2O_3$ glass material. The coefficient of thermal expansion is generally adjusted with an additive added to this glass material. As described above, the metal plate 1 has the largest coefficient of thermal expansion followed by the insulating material X, the insulating material Y, and the wiring pattern in decreasing order. Moreover, some of the mounted electronic components have even a smaller coefficient of thermal expansion.

The metal-based circuit board 100 according to this embodiment uses a fine particle powder made by atomizing an Ag—Pd alloy powder or an Ag powder, and a thick-film glass paste conductor having a softening point of 580° C. or less, so as to allow calcination at approximately 580° C. Moreover, the insulator also uses an insulating paste mixed with a glass and a ceramic powder having different softening points, attaining the softening point of 580° C. or less. Note that the exemplified compositions of the insulating layers and the electric conductor are not limited to the above, and arbitrary compositions are possible as long as the insulating layers and the electric conductor can be calcinated.

In summary, forming the two insulating layers 20 and 21 (the first and the second layer), each made of the insulating material X, on the metal plate 1 allows establishment of smooth surfaces of the insulating layers 20 and 21 even if unevenness exists in the surface of the metal plate 1. Furthermore, electric insulation of the metal plate 1 from the wiring pattern can be enhanced. Moreover, forming as the third layer the insulating layer 30 made of the insulating material Y smaller in coefficient of thermal expansion than that of the insulating material X allows decrease in influence of thermal expansion of the metal plate 1 on the wiring pattern, resulting in reduction in influence of warpage of the metal plate 1. Note that the insulating layer 20 and/or the insulating layer 21 is defined as a first insulating layer, and the insulating layer 30 is defined as a second insulating layer.

The metal-based circuit board 100, which has a high insulation performance from the metal plate 1 secured by the insulating layers 20, 21, and 30, has a predetermined conductor pattern (wiring patterns 10, 11, 12, and 13) formed on the insulating layer 30. Furthermore, the metal-based circuit board 100 has a structure such that the wiring pattern 10 as a conductor layer is covered by the overcoat layer 40b, which is an insulator, except for both of the wider ends, as shown in FIGS. 1 and 4.

Note that the overcoat layer 40 is not always needed, and may be omitted, or otherwise may be formed only on a required part on the metal-based circuit board if necessary. Moreover, aside from a glass material, epoxy resin etc. may be chosen and used as the overcoat layer 40 if necessary. Furthermore, the conductor material may be an arbitrary metal material, such as Ag, Ag—Pd, Ag—Pt, Au, Ni, or Cu if necessary.

Figure 5:
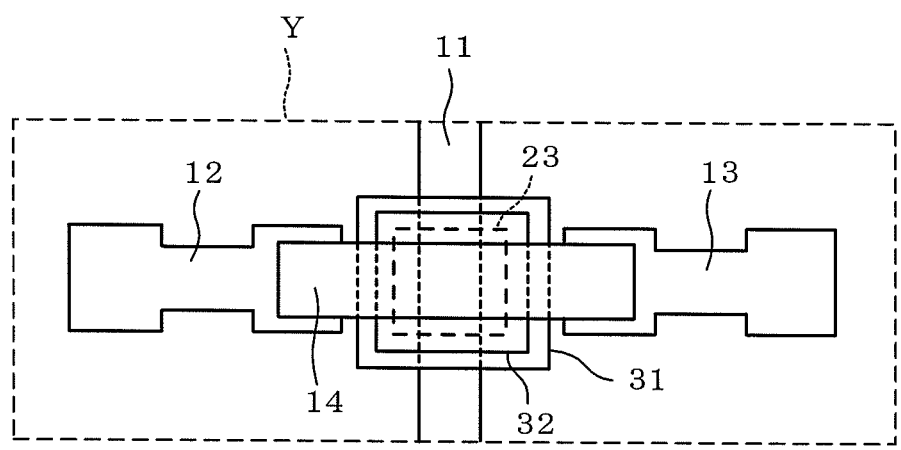
FIG. 5 is an illustration of a view when an overcoat layer covering portion Y of FIG. 1 is removed.

Next, the layer structure of the wiring region 51 in the metal-based circuit board 100 according to this embodiment is explained. FIG. 5 is a plan view illustrating a portion of the metal-based circuit board 100 of FIG. 1 surrounded by dotted lines and given a reference character Y, wherein the overcoat layer 40a is omitted from the illustration. Moreover, FIG. 6 is a cross-sectional view taken along line C-C' in a portion surrounded by dotted lines given the reference character Y.

Similar to the cross-sectional structures shown in FIGS. 2 and 4, the wiring region 51 in the metal-based circuit board 100 has the insulating layer 20 made of the insulating material X formed on the metal plate 1, thereby securing high insulation from the metal plate 1, and the insulating layer 21 made of the insulating material X as a second insulating layer, thereby further strengthening the withstand voltage. Moreover, the insulating layer 30 made of the insulating material Y smaller in coefficient of thermal expansion than the insulating material X is formed as a third insulating layer on the insulating layer 21. Furthermore, the insulating layer 22 made of the insulating material X is formed on the rear side of the metal plate 1.

As shown in FIG. 6, in the wiring region 51, high insulation performance against the metal plate 1 is secured by the insulating layers 20, 21, and 30, and predetermined conductor patterns or wiring patterns 11, 12, and 13 are arranged on the insulating layer 30. As shown in FIG. 5, an insulating layer 31 made of the insulating material Y is formed in a portion of the conductor pattern 11 between the conductor patterns 12 and 13, thereby securing insulation of the conductor pattern 11. Moreover, it has such a structure that an insulating layer 23 made of the insulating material X having a larger coefficient of thermal expansion than that of the insulating material Y constituting the insulating layer 31 is formed on the insulating layer 31, and an insulating layer 32 made of the insulating material Y is further formed on the insulating layer 23.

On the insulating layer 32, a conductor pattern 14 is formed as an upper layer wiring pattern, which electrically connects the conductor pattern 12 and the conductor pattern 13, and an overcoat layer 40 (40a) made of the insulating material Y is formed covering the conductor pattern 14. Note that the insulating layers 23, 31 and 32 secure electric insulation between the conductor patterns 11 and 14. Moreover, the insulating layer 23 made of the insulating material X is formed between the insulating layer 31 and the insulating layer 32, which are both made of the insulating material Y. This structure allows reduction in the stress developed in the conductor pattern 14 due to heat contraction. Note that the insulating layer 23 is defined as a first intermediate insulating layer, and the insulating layers 31 and 32 are defined as a second intermediate insulating layer.

Figure 7:
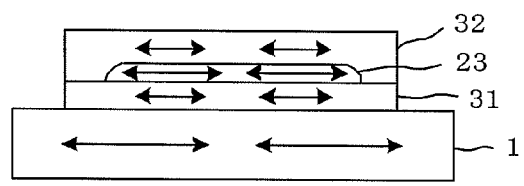
FIG. 7 is an illustration describing a structure of reducing the influence of thermal expansion of the metal-based circuit board according to this embodiment.

The metal-based circuit board 100 according to this embodiment suppresses warpage or distortion of the substrate itself, and secures bonding strength of respective layers even for a multilayered circuit. A principle for reducing influence of the coefficient of thermal expansion in the metal-based circuit board 100 according to this embodiment is explained next. FIG. 7 is an illustration explaining the principle for reducing influence of the coefficient of thermal expansion in the metal-based circuit board 100 according to this embodiment, and exemplifies a configuration of the insulating layers between the electric conductors of the substrate.

The junctioned combination of an electric conductor, an insulator, and a substrate, which differ in coefficient of thermal expansion, greatly relates to warpage or distortion of the substrate as a whole. As shown in FIG. 7, an alternating combination of two different materials in coefficient of thermal expansion, comprising on the metal plate 1 a three-layered structure, which is made from the layer 23 made of the insulating material X having a large coefficient of thermal expansion, and the layers 31 and 32 made of the insulating material Y having a small coefficient of thermal expansion as an example, negates mutual stresses, thereby reducing warpage and securing a tight bond between respective layers.

In other words, as shown in FIG. 7, a structure where the insulating material Y having a small coefficient of thermal expansion completely covers the insulating material X having a large coefficient of thermal expansion serves as a terminator of stresses generated when heat is added to the metal-based circuit board or heat is removed therefrom leading to expansion or contraction as shown by arrows in FIG. 7. As a result, the amount of warpage of the metal plate 1 may be reduced.

According to verification carried out by the inventors of this invention, the amount of warpage developed at the portion where only the insulating material Y (insulating layer 31) is formed on the metal substrate is 620 to 650 micrometers, but the amount of warpage developed at portion where the insulating layer having the three-layered structure shown in FIG. 7 is formed is 390 to 410 micrometers. This means that such a three-layered structure as shown in FIG. 7 controls the amount of warpage.

In other words, alternately laminating two different materials in coefficients of thermal expansion on the metal plate allows reduction in warpage. Furthermore, as shown in FIG. 6, additionally forming the insulating layer 22 on the rear side of the metal plate 1 is effective in correcting warpage of the metal plate 1.

A structure of sandwiching a predetermined insulating layer between other insulating layers having a smaller coefficient of thermal expansion allows prevention of detachment of a layer or disconnection of a wiring pattern etc. caused by the difference in thermal expansion.

Figure 8:
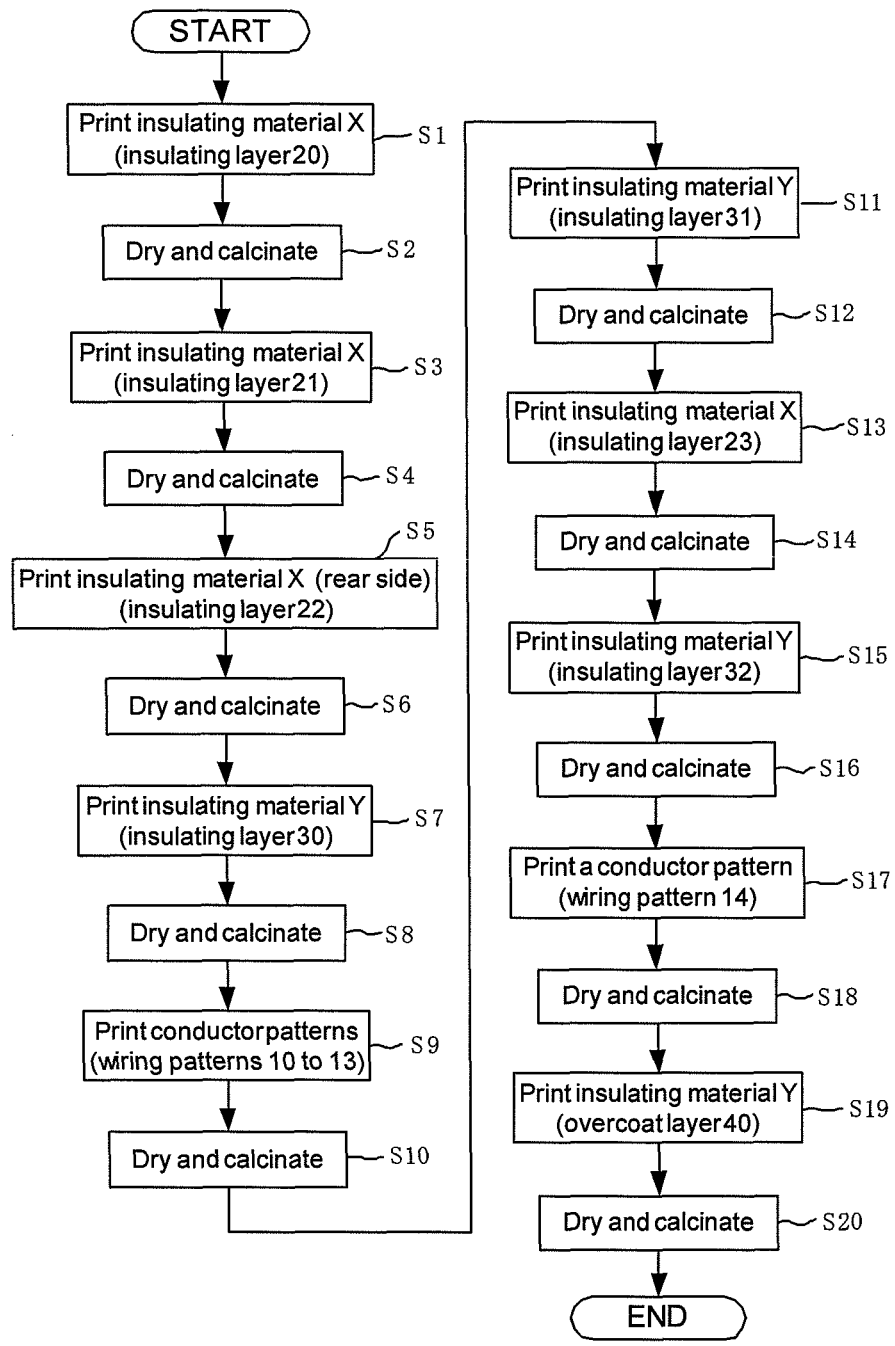
FIG. 8 is a flow chart describing a manufacturing process of the metal-based circuit board according to this embodiment.

Next, fabrication steps of the metal-based circuit board according to this embodiment are explained. FIG. 8 is a flow chart describing a manufacturing process of the metal-based circuit board according to this embodiment. In step S1 of FIG. 8, the insulating layer 20 (insulating layer A) made of the insulating material X is formed on the metal plate 1 through screen printing etc., so as to secure insulation from the metal plate 1. In the next step, step S2, the insulating material X formed on the metal plate 1 is dried, and the resulting dried insulating material X is then calcinated. As a result, the first insulating layer 20 is formed on the metal plate 1.

In step S3, the insulating layer 21 (insulating layer A) made of the insulating material X is formed on the insulating layer A formed in steps S1 and S2 by screen printing etc., so as to enhance withstand voltage. Afterwards, the insulating material X is dried and calcinated in step S4, thereby forming the insulating layer 21 as a second insulating layer. Note that since the first and the second insulating layers have the same structure, the calcinating step in step S2 may be omitted. That is, alternatively, without calcination after drying the insulating material X of the first layer in step S2, the subsequence step S3 of printing the insulating material X may be carried out, and then step S4 may follow.

Since multiple insulating layers are formed on the metal plate 1, even if unevenness exists in the surface of the metal plate 1, a smooth surface of the insulating layer is securable. Furthermore, since the insulating material X having a similar coefficient of thermal expansion to that of the metal plate 1 as compared to the insulating material Y, is used to form the insulating layer 20 (insulating layer A) on the surface of the metal plate 1, the stress on the layers formed on the insulating layer 20 may be relaxed. Moreover, since it is formed by stacking multiple insulating layers like the insulating layers 20 and 21, electric insulation of the metal plate 1 from the wiring pattern to be formed later may be secured.

After forming the two-layered insulating layer A on the surface of the metal plate 1, the insulating material X is screen-printed on the rear side of the metal plate 1 in step S5, thereby forming the insulating layer 22 (insulating layer A). The screen-printing of the insulating material X here is carried out such that the same pattern as the insulating layer 20 printed on the surface of the metal plate 1 is widely printed on the rear side of the metal plate 1. In the next step, step S6, the insulating material X printed in the above-described step S5 is dried and calcinated, thereby forming the insulating layer 22 (insulating layer A) on the rear side of the metal plate 1.

In step S7, the insulating material Y having a smaller coefficient of thermal expansion than that of the insulating material X is printed on the insulating layer 21 formed in the above-described step S3, thereby forming the insulating layer 30 (insulating layer B). In step S8, the insulating material Y is dried and calcinated, thereby forming the third insulating layer 30 on the metal plate 1. The coefficient of thermal expansion of the insulating material Y is closer to that of the wiring pattern as compared to the insulating material X. Therefore, the coefficient of thermal expansion of the insulating layer 30 is smaller than that of the insulating layer 21, and is close to that of the wiring pattern. As a result, the insulating layers 20, 21, and 30 existing between the metal plate 1 and the wiring pattern reduce the difference in thermal expansion between the metal plate 1 and the wiring pattern in continuous fashion, thereby enhancing reliability of the circuit. Moreover, the insulation performance from the metal plate 1 is securable by the first to the third insulating layer.

In step S9, circuit conductor patterns (wiring patterns 10 to 13) on the insulating layer 30 are screen-printed so as to form predetermined patterns shown in FIGS. 3 and 5. In step S10, these conductor patterns are dried and calcinated.

In step S11, as shown in FIGS. 5 and 6, a rectangular-shaped insulating material Y is printed so as to cover a part of the conductor layer (conductor pattern 11) formed in step S9, namely a region between the wiring pattern 12 and the wiring pattern 13. In the next step, step S12, the insulating material Y printed in step S11 is dried and calcinated, forming the insulating layer 31 (insulating layer B).

In the next step, step S13, the insulating material X having a larger coefficient of thermal expansion than that of the insulating material Y is printed on the insulating layer 31 formed in step S11. It then goes through a drying and calcinating process in step S14, thereby forming the insulating layer 23 (insulating layer A). The insulating layer 23 is formed in a smaller area than the insulating layer 31 so that it cannot protrude from the insulating layer 31. The insulating layer 23 is used for electrically insulating between wirings formed in the upper and the lower layer in the direction of the layer height and reducing the stress developed due to heat contraction. In step S15, the insulating layer 32 (insulating layer B) made of the insulating material Y is printed so as to completely cover the insulating layer 23 formed in step S13. The insulating material Y is then dried and calcinated in step S16.

In step S17, a predetermined conductor pattern (wiring pattern 14) is printed on the insulating layer 32 formed in step S15. In the next step, step S18, the conductor pattern is dried and calcinated, forming the upper layer wiring pattern 14. The insulating layers 31, 23, and 32 are formed between the wiring patterns 14 and 11 in a region where the wiring patterns 14 and 11 intersect (given reference character C in FIG. 3). In step S19, an insulating layer (overcoat layer) made of the insulating material Y is printed so as to cover the upper layer wiring pattern 14. In step S20, it is then dried and calcinated forming the overcoat layer 40.

As explained above, according to this embodiment, two insulating layers A having a comparatively large coefficient of thermal expansion is formed on the metal plate having a large coefficient of thermal expansion, an insulating layer B having a small coefficient of thermal expansion is formed on the insulating layer A, and an electric conductor is formed on the insulating layer B. With such a configuration, the insulating layer A reduces influence of the thermal expansion of the metal plate. Furthermore, formation of the electric conductor on the insulating layer B having the small coefficient of thermal expansion allows reduction in coefficient of thermal expansion in continuous fashion. Consequently, even if it is with a metal plate, the influence on the electric conductor deployed on the substrate may be reduced effectively, suppressing warpage or distortion of the substrate and peeling of the electric conductor etc.

That is, the aforementioned layered configuration allows such a configuration of a substrate, an insulating layer A, an insulating layer B, and an electric conductor in this order, namely, deployment of decreasing the coefficient of thermal expansion in stages until the conductor, thereby reducing the influence of warpage of the substrate. Moreover, since in the intersecting region of the electric conductors, insulating layers having contact with electric conductors are of the insulating layer B having a closer coefficient of thermal expansion to those of the electric conductors than that of the insulating layer A, the influence of the behavior of the metal plate due to the heat is reduced even in the case of a multilayered structure, such as a substrate, an insulating layer A, an insulating layer B, an electric conductor, an insulating layer B, an insulating layer A, an insulating layer B, and an electric conductor in this order.

Moreover, even if a multilayered pattern is formed on the metal plate having a large coefficient of thermal expansion, a structure where an insulating layer is sandwiched between insulating layers having smaller coefficient of thermal expansion allows the insulating layer B having a different expansion stress or contraction stress from that of the insulating layer A to receive and suppress the expansion stress or contraction stress from the insulating layer A in four directions; in other words, that structure serves as a stress reducing means. As a result, the influence of the thermal expansion or heat contraction of the entire metal plate may be reduced effectively.

Furthermore, the aforementioned configuration of the insulating layers allows reduction in influence of the thermal expansion or heat contraction of the metal plate on electric conductors even if additional conductors are laminated on the insulating layers. While warpage or distortion is thus suppressed to be minimal, bonding strength of the upper and the lower layer is maintained, and degree of freedom for circuit design is not impaired, thereby providing a highly reliable circuit structure. The bonding strength of the upper and the lower layer is maintained because of the following reason. That is, the upper and the lower layer made of the insulating material Y are laminated such that the insulating material Y wraps the insulating material X, and thus the bonded surfaces in the periphery of the insulating material X are made from the same insulating material Y, in other words, the junctions are made of the same material. Therefore, the strength of the junction interfaces made of the same material is greater than that of junction interfaces made from different materials. Furthermore, since the insulating material X is greatly different in coefficient of thermal expansion from the electric conductor as compared to the insulating material Y, a structure where the insulating material X has no direct contact with the electric conductor is used.

Moreover, by forming a multilayered insulating layer and a conductor layer after formation of an insulating layer made of the insulating material X on the rear side of a metal plate, warpage of the substrate developed due to the insulating layer and the conductor layer formed on the surface of the metal plate may be corrected.

The present invention is not limited to the aforementioned embodiment, and various modifications thereof are possible within the scope of the present invention. The insulating materials X and Y are used in this embodiment as an example. The present invention, however, is not limited thereto, and a combination of three kinds or more of insulating materials having different respective coefficients of thermal expansion may be used. Alternatively, in the structure of sandwiching the first intermediate insulating layer (insulating layer 23) between the second intermediate insulating layers (insulating layers 31 and 32), the insulating layer 31 formed under the first intermediate insulating layer may be different in coefficient of thermal expansion from the insulating layer 32 formed over the first intermediate insulating layer; wherein the second intermediate insulating layer should be smaller in coefficient of thermal expansion than the first intermediate insulating layer.

Moreover, of the manufacturing steps of the metal-based circuit board shown in FIG. 8, the calcinating process in step S4 may be skipped, and the insulating material X on both front and rear sides may be calcinated simultaneously in step S6 instead. Alternatively, an insulating layer A may be formed on the rear side of a substrate after the first insulating layer A is formed on the substrate front surface in steps S1 and S2, and the second insulating layer A may then be formed on the substrate front surface.

Furthermore, in place of forming the insulating layer A on the rear side of the substrate in steps S5 and S6 after formation of the second insulating layer A on the substrate front surface, printing the insulating material X of the second layer and printing the insulating material X on the rear side may be carried out simultaneously, and both sides of the substrate may then be dried and calcinated afterwards. Otherwise, simultaneously printing the insulating material X on the rear side of the substrate and printing the insulating material X of the first layer may be carried out, simultaneously dried and calcinated them afterwards, and then forming the second insulating layer A.

Moreover, calcinating the insulating material X in step S14 mentioned above may be omitted, and the insulating materials X and Y may be simultaneously calcinated through the calcinating process in step S16 instead. This allows the insulating material X to be calcinated while being wrapped by the insulating material Y, thereby preventing contraction and expansion due to heat, alleviating the stress in the direction of negating the stress, and obtaining a desirable result.

The metal-based circuit board according to this embodiment mentioned above has only a single insulating layer A formed on the rear side of the substrate. However, it is not limited to that configuration, and an additional insulating layer A may be formed on the rear side of the substrate, thereby improving the warpage preventive effect of the substrate. Furthermore, such a structure that an insulating layer B having a small coefficient of thermal expansion is formed on the surface of the second insulating layer A is possible. This structure corrects or prevents warpage of the substrate developed during calcination.

In any of the aforementioned cases of the insulating layers formed on the rear side of the substrate, a part or entirety of the insulating layer formed on the rear side may be removed after a circuit is formed and calcinated. The insulating layer is formed on the rear side of the substrate so as to correct warpage developed during substrate fabrication. However, once the metal-based circuit board is completed, the rear side of the substrate may be connected and fastened to a heat sink etc. In this case, removal of the insulating layer on the rear side of the substrate serves for enhancement in heat dissipation. Needless to say, when insulation is needed on the rear side of the substrate, the insulating layer on the rear side should be left as is.

Meanwhile, the metal-based circuit board according to the aforementioned embodiment may have a structure without forming an insulating layer on the rear side of the substrate. When an insulating layer is not formed on the rear side of the substrate, warpage of the substrate may occur more often than in the case where an insulating layer is formed. Whether or not the insulating layer should be formed on the rear side of the substrate should depend on allowable degree of warpage. Furthermore, since the degree of warpage differs according to the circuit formed on the front side, whether or not an insulating layer should be formed on the rear side of the substrate may be determined according to that degree of warpage.

What is claimed is:

1. A metal-based circuit board comprising a first conductor layer formed on a substrate made of a metal material via an insulating layer, and a second conductor layer formed on the first conductor layer via an insulating layer; wherein the insulating layer between the first and the second conductor layer comprises a first intermediate insulating layer and second intermediate insulating layers, and has a structure of the first intermediate insulating layer sandwiched between the second intermediate insulating layers; wherein coefficient of thermal expansion of the first intermediate insulating layer is larger than that of the second intermediate insulating layers.

2. The metal-based circuit board according to claim 1, wherein the first and the second conductor layer do not come in direct contact with the first intermediate insulating layer.

3. The metal-based circuit board according to claim 2, wherein the insulating layer between the first and the second conductor layer has a structure where the first intermediate insulating layer is completely wrapped by the second intermediate insulating layers.

4. The metal-based circuit board according to claim 3, wherein coefficient of thermal expansion of the first intermediate insulating layer and that of the second intermediate insulating layers are smaller than that of the substrate, and larger than those of the first and the second conductor layer.

5. The metal-based circuit board according to claim 1, wherein the insulating layer between the substrate and the first conductor layer has a structure where a first insulating layer is formed on the surface of the substrate, a second insulating layer having a smaller coefficient of thermal expansion than that of the first insulating layer is formed on the first insulating layer, and the first conductor layer is formed on the second insulating layer.

6. The metal-based circuit board according to claim 5, wherein an insulating layer is formed on the rear side of the substrate.

* * * * *